United States Patent
Sindhushayana et al.

(10) Patent No.: US 6,292,918 B1
(45) Date of Patent: Sep. 18, 2001

(54) EFFICIENT ITERATIVE DECODING

(75) Inventors: Nagabhushana T. Sindhushayana, San Diego, CA (US); Jeremy M. Stein, Haifa (IL)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/186,971

(22) Filed: Nov. 5, 1998

(51) Int. Cl.[7] .......................... H03M 13/29; H03M 13/45
(52) U.S. Cl. .......................... 714/755; 714/776; 714/786
(58) Field of Search ........................ 714/794, 776, 714/755, 786

(56) References Cited

U.S. PATENT DOCUMENTS

| | | | |
|---|---|---|---|
| 5,446,747 | 8/1995 | Berrou | 371/45 |
| 5,497,404 | * 3/1996 | Grover et al. | 375/357 |
| 5,563,897 | 10/1996 | Pyndiah et al. | 371/37.4 |
| 5,734,962 | * 3/1998 | Hladik et al. | 455/12.1 |
| 5,838,267 | * 11/1998 | Wang et al. | 341/94 |
| 5,978,365 | * 11/1999 | Yi | 370/331 |
| 5,983,384 | * 11/1999 | Ross | 714/755 |
| 6,023,783 | * 2/2000 | Divsalar et al. | 714/792 |
| 6,029,264 | * 2/2000 | Kobayashi et al. | 714/755 |
| 6,044,116 | * 3/2000 | Wang | 375/265 |

OTHER PUBLICATIONS

Divsalar et al., "Turbo Codes for PCS Applications", 1995 International Conference on Communications, Jun. 1995, pp. 18–22.*

Chang et al., "Q–ary Turbo Codes with QAM Modulations", 1996 5th IEEE International Confeence on Universal Personal Communications, Oct. 1996, pp. 814–817.*

Burkert et al., "Improving Channel Coding of the ETSI– and MPEG–Satellite Transmission Standards", 1997 IEEE Global Telecommunications Conference, Nov. 1997, pp. 1539–1542.*

Peng et al., "Joint Channel and Source Decoding for Vector Quantized Images using Turbo Codes", 1998 IEEE International Symposium on Circuit and Systems, Jun. 1998, pp. IV–5–IV–8.* van Wyk et al., Turbo–Coded/Multi–Antenna Diversity Combining Scheme for DS/CDMA Systems, 1998 IEEE 5th International Symposium on Spread Spectrum Techniques and Applications, Sep. 1998, pp. 18–22.*

Peng et al., "Joint decoding of Turbo Codes for Subband Coded Images", 1998 International Conference on Image Processing, Oct. 1998, pp. 329–333.*

"An Introduction to Turbo Codes", M. Valenti, Bradley Dept. of Elect. Eng., Virginia Polytechnic Inst. & S.U., Blacksburg, Virginia.

1996 IEEE Transactions on Information Theory, vol. 42, No. 2, "Iterative Decoding of Binary Block and Convolutional Codes", J. Hagenauer et al., pp. 429–445.

1998 International Journal of Satellite Communications, vol. 16, "Implementation and Performance of a Turbo/Map Decoder", S. Pietrobon, pp. 23–46.

1998 IEEE Workshop on Signal Processing Systems (SiPS) Proceedings in Boston, MA on Oct. 8–10, 1998, "VLSI Design and Implementation of Low–Complexity Adaptive Turbo–Code Encoder and Decoder for Wireless Mobile Communication Applications", S. Hong et al., pp. 233–242.

* cited by examiner

Primary Examiner—Stephen M. Baker
(74) Attorney, Agent, or Firm—Philip R. Wadsworth; Thomas R. Rouse

(57) ABSTRACT

Apparatus for iterative decoding of a sequence of signal packets coded in accordance with a multi-component coding scheme. The apparatus includes a plurality of decoders, each of which performs a respective different decoding method on one of the signal packets, such that the plurality of decoders operate substantially concurrently.

34 Claims, 2 Drawing Sheets

EFFICIENT ITERATIVE DECODING

FIELD OF THE INVENTION

The present invention relates generally to iterative decoding, and specifically to fast iterative decoding of multiple-component codes.

BACKGROUND OF THE INVENTION

Transmission of digital data is inherently prone to interference which may introduce errors into the transmitted data. Error detection schemes have been suggested to determine as reliably as possible whether errors have been introduced into the transmitted data. For example, it is common to transmit the data in packets, and add to each packet a CRC (cyclic redundancy check) field, for example of a length of 16 bits, which carries a checksum of the data of the packet. When a receiver receives the data, it calculates the same checksum on the received data and verifies whether the result of its calculation is identical to the checksum in the CRC field.

When the transmitted data is not used on-line, it is possible to request re-transmission of erroneous data when errors are detected. However, when the transmission is performed on-line such as in telephone lines, cellular phones, remote video systems, etc., it is not possible to request re-transmission.

Convolution codes have been introduced to alow receivers of digital data to correctly determine the transmitted data even when errors may have occured during transmision. The convolution codes introduce redundancy into the transmitted data to be transmitted, forming encoded packet data and pack the transmitted data into packets in which the value of each bit is dependent on earlier bits in the sequence. Thus, when a few errors occur, the receiver can still deduce the original data by tracing back possible sequences in the received data.

To further improve the performance of a transmission channel, some coding schemes include interleavers, which mix up the order of the bits in the packet during coding. Thus, when interference destroys a few adjacent bits during transmission, the effect of the interference is spread out over the entire original packet and can more readily be overcome by the decoding process. Other improvements may include multiple-component codes which include coding the packet more than once in parallel or in series. For example, U.S. Patent No. 5,446,747, which is incorporated herein by reference, describes an error correction method using at least two convolutional codings in parallel. Such parallel encoding is known in the art as "Turbo coding."

For multiple component codes, optimal decoding is often a very complex task, and may require large periods of time, not usually available for on-line decoding. In order to overcome this problem, iterative decoding techniques have been developed. Rather than determining immediately whether received bits are zero or one, the receiver assigns each bit a value on a multi-level scale representative of the probability that the bit is one. A common scale, referred to as LLR probabilities, represents each bit by an integer in the range $\{-32, 31\}$. The value of 31 signifies that the transmitted bit was a zero with very high probability, and the value of $-32$ signifies that the transmitted bit was a one, with very high probability. A value of zero indicates that the value is indeterminate.

Data represented on the multi-level scale is referred to as "soft data," and iterative decoding is usually soft-in/soft-out, i.e., the decoding process receives a sequence of inputs corresponding to probabilities for the bit values and provides as output corrected probabilities taking into account constraints of the code. Generally, a decoder which performs iterative decoding, uses soft data from former iterations to decode the soft data read by the receiver. A method of iterative decoding is described, for example, in U.S. Patent No. 5,563,897, which is incorporated herein by reference.

During iterative decoding of multiple-component codes, the decoder uses results from decoding of one code to improve the decoding of the second code. When parallel encoders are used, as in Turbo coding, two corresponding decoders may conveniently be used in parallel for this purpose.

The iterative decoding is carried out for a plurality of iterations until it is believed that the soft data closely represents the transmitted data. Those bits which have a probability indicating that they are closer to one (for example, between 0 and 31 on the scale described above) are assigned binary zero, and the rest of the bits are assigned binary one.

Generally, the iterative process is repeated a predetermined number of times. According to "An Introduction to Turbo Codes," by Matthew C. Valenti, which can be found at lamarr.mprg.ee.vt.edu/documents/turbo.pdf and is incorporated herein by reference, the predetermined number of iterations is about 18. However, this article further states that in many cases as few as 6 iterations can provide satisfactory performance. "Iterative Decoding of Binary Block Codes," by Joachim Hagenauer, Elke Offer and Lutz Papke, IEEE Trans. of Information Theory, Vol. 42, No. 2, pp. 429–445 (March 1996), which is incorporated herein by reference, suggests using a cross entropy criteria to determine when to stop the iterative decoding process individually for each packet. Thus, the calculation power of a decoder may be used more efficiently than when all packets are decoded using the same number of iterations. However, the cross entropy criterion is in itself very complex, reducing substantially the gain in efficiency in applying variable numbers of iterations.

In one commonly-used multiple-component coding scheme, the packet is first encoded by a first "outer" coding scheme. Thereafter, it is interleaved and is then encoded by a second "inner" coding scheme. During decoding, the inner code is first decoded, the result is de-interleaved, and then the outer code is decoded. The results of decoding the outer code are thereafter used in a second iteration of decoding the inner code to improve its results. This process is continued iteratively until the coded packet is satisfactorily decoded.

The above-described decoding scheme is typically implemented by a single hardware decoder, which alternately decodes the inner and outer codes. However, when very fast decoding is needed, and the inner and outer codes are substantially different, the computational load is generally beyond the capability of a single decoder of conventional design. Therefore, it has been suggested to use a decoder including two processors, one for the inner code and one for the outer code. However, this results in having each of the processors idle half of the time, while it waits for results from the other processor.

SUMMARY OF THE INVENTION

It is an object of some aspects of the present invention to provide methods and apparatus for fast iterative decoding of codes based on two or more different convolutional encoding schemes.

It is another object of some aspects of the present invention to provide apparatus for efficient iterative decoding of convolution codes.

It is a further object of some aspects of the present invention to provide an efficient method for determining how many iterations are needed for reliable decoding of a packet.

In preferred embodiments of the present invention, the decoding time allotted for decoding each code in a multi-code series or parallel coding scheme is made substantially equal. A decoder including two processors receives two packets of data in sequence and decodes them simultaneously. While one packet is being decoded in a first processor, the second processor decodes the second packet. When both processors finish a single iteration, the packets are switched between the processors, and another iteration is performed. Thus, both processors are substantially constantly in use, and codes may be decoded twice as fast as in prior art schemes of comparable hardware complexity. Preferably, both processors operate concurrently at least 50% of their operation time on any input packet.

In some preferred embodiments of the present invention, the two packets are decoded independently of each other, so that termination of decoding of the packets is independent. When a first packet is finished being decoded, a new packet may enter one of the decoders, regardless of whether the second packet has finished being decoded.

In some preferred embodiments of the present invention, the multi-code scheme includes an inner coding scheme and an outer coding scheme. Preferably, the inner and outer coding schemes are chosen such that the decoding time of a single iteration of both of them is approximately the same. Alternatively or additionally, the processor that finishes an iteration first waits for the second processor to finish processing, and then the packets are switched between the decoders. Preferably, the inner and outer coding schemes are different and cannot easily be decoded by the same processor.

In another aspect of the present invention, during decoding of each packet, a simple method is used for determining when to stop the iterative process. A termination checking procedure is preferably performed after substantially each iteration, and includes determining a minimal absolute probability value associated with any of the bits in the packet. When the minimal absolute probability value is above a predetermined threshold, indicating that all of the bits have been assigned either the value "1" or "0" with relatively high probability, the iterative process is terminated.

Alternatively or additionally, each packet is transmitted with a CRC field. After each decoding iteration, the termination checking procedure checks whether the CRC value computed from the data to be output from that iteration is compatible with the CRC field. Preferably, the checking procedure checks the CRC field only when the minimal probability value is above the threshold. If the CRC field is compatible with the extracted data, the iteration procedure is terminated.

In some preferred embodiments of the present invention, the checking procedure begins only after a minimal initial number of iterations, in order to reduce the probability of the CRC check returning an apparently "correct" result although the decoded data is incorrect. Preferably, the minimal number of iterations is between four and eight. The number of iterations is preferably chosen to be a number of iterations which for most packets does not bring the minimal probability value above the threshold. Further preferably, the iterative process is terminated after a maximal number of iterations regardless of any other conditions. Preferably, the maximal number of iterations is between 20 and 30.

In other preferred embodiments of the present invention, the minimal absolute probability value may be replaced by an average probability value, by a median probability value, or by any other value indicative of the progress of the iterative decoding process. For example, when it is desired to minimize a bit error (BER) criterion rather than a packet error rate, the minimal absolute value is preferably replaced by a next-to-minimum value, i.e., the lowest value after ignoring one or two exceptions.

There is therefore provided in accordance with a preferred embodiment of the present invention, apparatus for iterative decoding of a sequence of signal packets coded in accordance with a multi-component coding scheme, including a plurality of decoders, each of which performs a respective different decoding method on one of the signal packets, such that the plurality of decoders operate substantially concurrently.

Preferably, the plurality of decoders operate concurrently on different, respective packets.

Preferably, the plurality of decoders operate concurrently during at least 50% of the operation time during which the apparatus decodes the sequence.

Further preferably, the plurality of decoders operate concurrently during substantially the entire operation time of the apparatus.

Preferably, each of the plurality of decoders receives as its input a packet processed by another one of the plurality of decoders in most of the iterations.

Preferably, the plurality of decoders includes two decoders.

Preferably, the apparatus further includes a plurality of memory units to which the decoders output the packets after decoding.

Preferably, the packets are interleaved or de-interleaved after decoding.

Preferably, each of the plurality of decoders requires a generally equal decoding time to that of the other decoders.

Preferably, the multi-component coding scheme includes a parallel coding scheme.

Alternatively, the multi-component coding scheme includes a serial coding scheme.

Preferably, the plurality of decoders includes APP decoders.

There is further provided in accordance with a preferred embodiment of the present invention, a method of decoding a sequence of packets of data, coded in accordance with a multi-component coding scheme including inner and outer codes, including decoding a first packet in a first decoder, which decodes the inner code to generate a first decoded output packet, and decoding the first decoded output packet in a second decoder, which decodes the outer code, while substantially concurrently decoding a second packet in the first decoder.

Preferably, the method includes outputting the first packet from the second decoder to the first decoder, so as to repeat decoding the inner code.

Preferably, the method includes repeatedly decoding the first and second packets in the first and second decoders in alternation.

Preferably, the method includes de-interleaving the first output packet before decoding it in the second decoder.

Preferably, the multi-component coding scheme includes a serial coding scheme.

There is further provided in accordance with a preferred embodiment of the present invention, in a system for iterative decoding of a packet of soft data in which each bit is represented by a probability value, a method for determining after which of a plurality of iterations to terminate the decoding, including determining a probability value of the bits in the packet, and deciding to terminate the decoding only if the probability value is above a predetermined value.

Preferably, determining the probability value includes determining a minimal probability of the hard data values of the bits in the packet.

Preferably, determining the minimal probability value includes determining a minimal absolute log probability value.

Preferably, the method includes verifying that an error detection field in the packet is correct, and deciding to terminate includes deciding to terminate only if the error detection field is correct.

Preferably, the process of verifying that the error detection field is correct is performed when the probability value is above the predetermined value.

Preferably, the process of determining the probability value is performed only after a predetermined number of decoding iterations have been performed on the packet.

Preferably, determining the probability value includes determining the probability value on a decoded copy of the bits in the packet.

Alternatively or additionally, determining the probability value includes determining the probability value on a coded copy of the bits in the packet.

There is further provided in accordance with a preferred embodiment of the present invention, apparatus for iterative decoding of coded packets including for each bit a probability value, including a decoder which performs iterations of decoding the packet, and a control unit which determines whether an additional iteration is to be performed by the decoder responsive to the probability values of the bits in the packet.

Preferably, the control unit causes the decoder to perform a predetermined number of iterations without checking the packet.

Preferably, the control unit determines whether an additional iteration is to be performed by the decoder responsive to an error detection field in the packet if the probability values fulfill a predetermined condition.

Preferably, the control unit does not initiate an additional iteration by the decoder if the error detection field is correct.

Preferably, the decoder includes an APP decoder.

Preferably, the control unit calculates a minimal probability of the hard data values of the bits in the packet and determines whether an additional iteration is to be performed responsive to the minimal probability.

Further preferably, the control unit calculates a minimal absolute log probability value.

Preferably, the control unit calculates the minimal probability based on a probability value of either a decoded or coded copy of the packet.

The present invention will be more fully understood from the following detailed description of the preferred embodiments thereof, taken together with the drawings, in which:

DETAILED DESCRIPTION OF PREFERRED EMBODIMENTS

Figure 1:
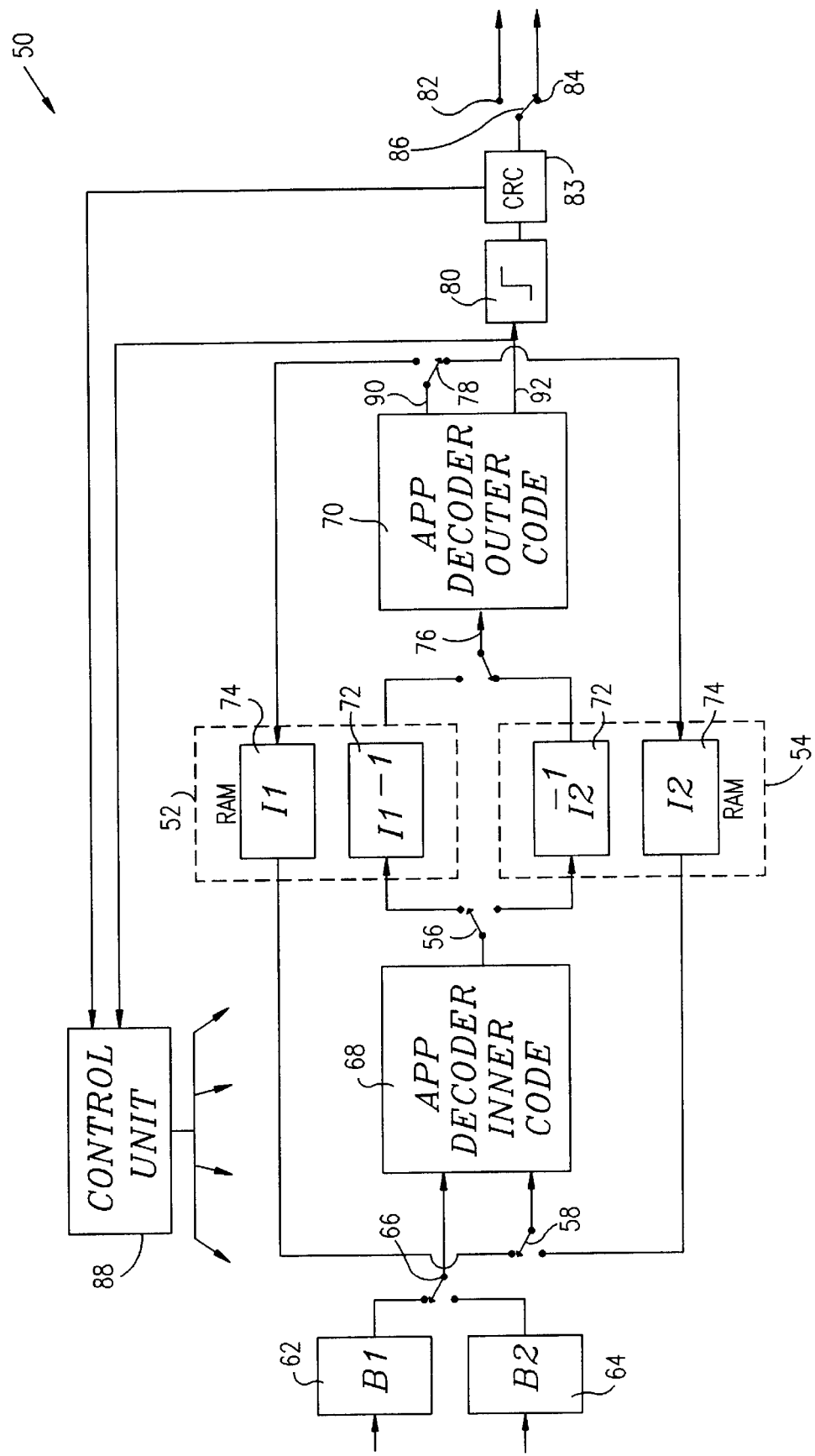
FIG. 1 is a block diagram of an iterative decoder, in accordance with a preferred embodiment of the present invention.

FIG. 1 is a block diagram of a decoding processor 50, in accordance with a preferred embodiment of the present invention. Processor 50 is preferably part of a digital receiver which receives analog signals. The received signals are digitized and preferably transformed to a scale in the range $\{-32, 31\}$ representing probability values in a logarithmic scale, as is known in the art. Alternatively, the scale may be in any other range and/or may be a non-logarithmic scale. Preferably, decoding processor 50 receives the digitized signals from a demodulator or channel de-interleaver (not shown), as is known in the art. The received digital signals were encoded before sending in accordance with a multi-code scheme, preferably including, in series; an outer coding scheme, interleaving, and an inner coding scheme. Alternatively or additionally, the multi-code scheme includes a Turbo code scheme, or any other suitable iterative scheme.

The digitized data incoming to processor 50 is accumulated in two parallel buffers 62 and 64, wherein buffer 62 receives a first packet of data and buffer 64 receives a second packet. An inner decoder 68, which decodes the inner code, is connected alternately to buffers 62 and 64 via a switch 66. Decoder 68 is preferably an A Posteriori Probability (APP) decoder, also termed a Maximum A Posteriori (MAP) decoder. Such decoders are known in the art and are described, for example, in "Implementation and Performance of a Turbo/Map Decoder," by Steven S. Pietrobon, International Journal of Satellite Communications, vol. 16, 1998, pp. 23–46, which is incorporated herein by reference, as well as in a concurrently filed U.S. entitled "Efficient Trellis State Metric Normalization," which is assigned to the assignee of the present invention and is incorporated herein by reference. Further alternatively, decoder 68 may comprise other decoders known in the art including SOVA decoders.

Two dual-port memories, preferably RAMs 52 and 54, are connected alternately to inner decoder 68 through two switches 56 and 58. Preferably, switch 56 conveys decoded output from decoder 68 to one of RAMs 52 and 54, while switch 58 conveys input to decoder 68 from the same one of the RAMs. Preferably, the output from decoder 68 is de-interleaved by a de-interleaver 72 upon its entrance to RAM 52 or 54 or upon its exit therefrom. Likewise, the input to decoder 68 through switch 58 is preferably interleaved by interleavers 74 associated with RAMs 52 and 54.

An outer APP (or MAP) decoder 70, preferably similar to decoder 68 in structure although directed to decoding a different code, i.e., the outer code, is connected alternately to RAMs 52 and 54 via a switch 76. Preferably, decoder 70 comprises two output lines: a first output line 90 which provides probability information on coded signals for further processing, and a second output line 92 which provides probability information on decoded data signals. A switch 78 connected to output line 90 preferably alternately directs output from decoder 70 to interleavers 74 of RAMs 52 and 54. After a sufficient number of iterations in processor 50, the output from decoder 70 on output line 92 is preferably passed to a decision unit 80, which converts soft data to hard data. Preferably, the hard data is passed to a CRC checking unit 83 which determines and checks the CRC of the decoded packet.

Preferably, decoder 68 outputs the decoded data as extrinsic information, i.e., as the difference between the LLR probabilities of its input data from switch 58 and its calculated improved LLR probabilities, as is known in the art and defined, for example, in the above mentioned publication by Hagenauer et al. Decoder 70 on the other hand preferably has two output lines 90 and 92, as described above, one of which (preferably line 92) conveys extrinsic information as feedback to decoder 68 and the other of which (preferably line 90) conveys a priori probability information, i.e., the calculated LLR probabilities, to decision unit 80.

The decoded hard data is preferably output from processor 50 via a switch 86 which directs the output on two separate lines 82 and 84, depending on in which of buffers 62 and 64 the original packet was stored. Preferably, a control unit 88 controls the operation of decoders 68 and 70, the states of the switches, and other operations of processor 50.

During operation, two successive packets of data are input to buffers 62 and 64, respectively. Switches 66 and 56 are set to their upper states (as shown in FIG. 1), and decoder 68 performs a first cycle in a first inner decoding iteration on the packet in buffer 62. In the first inner decoding iteration, decoder 68 receives the input packet from buffer 62 and generates an output packet in RAM 52. The output packet is preferably de-interleaved in RAM 52 by de-interleaver 72, thus preparing the packet for input to decoder 70. The state of switch 58 does not affect the operation of decoder 68 and therefore does not matter or is disconnected.

Thereafter, switches 56 and 66 are brought to their lower state, and switches 76 and 78 are brought to their upper states. At this point control unit 88 initiates operation of both decoders 68 and 70. Decoder 68 performs a first inner decoding iteration on the packet in buffer 64 and generates an output packet in RAM 54. The output packet is preferably de-interleaved by de-interleaver 72 on its way into RAM 54 in preparation for input to decoder 70 during the next cycle of the processor. Alternatively or additionally, de-interleaver 72 de-interleaves the packet on its way out of RAM 54.

Concurrently, decoder 70 performs a first outer decoding iteration on the packet in RAM 52. Decoder 70 operates on the de-interleaved packet in RAM 52 and generates an output packet back in RAM 52. The output packet is interleaved, by interleaver 74 associated with RAM 52, in preparation for re-use by decoder 68.

In a third operation cycle, switches 56, 58 and 66 are brought to their upper state and switches 76 and 78 are brought to their lower state, as in the first cycle. Decoder 68 receives input from both buffer 62 and RAM 52 and performs a second inner decoding iteration on the packet in buffer 62. The output packet is passed to RAM 52 as in the first inner decoding iteration. Concurrently, decoder 70 performs a first outer decoding iteration on the packet from buffer 64. The output is returned to RAM 54 to be interleaved by unit 74 in preparation for use by decoder 68. Thereafter the states of switches 56, 58, 66, 76 and 78 are changed, decoder 68 operates on the packet in buffer 64 and decoder 70 operates on the packet from buffer 62. Thus, decoders 68 and 70 interchangeably perform decoding iterations on the packets in buffer 62 and 64. Both of decoders 68 and 70 operate concurrently, and thus, using the same amount of hardware as processors known in the art, it is possible to achieve twice the decoding speed.

Control unit 88 decides when to terminate the decoding of the packets, preferably in accordance with a method described hereinbelow. The output from decoder 70 is passed both through switch 78 and to decision unit 80, which derives hard data (0's and 1's) from the signs of the soft data in the packet, as described hereinabove or as is generally known in the art. The hard data is passed to CRC checking unit 83 which determines the CRC and passes it to control unit 88. According to the CRC and other information, control unit 88 decides whether to perform another decoding iteration as described further hereinbelow.

Alternatively or additionally, after a predetermined number of decoding iterations, the decoding of each packet is terminated. Switch 86 is set on whichever of the two lines 82 or 84 the packet is to be output, and preferably switch 78 is disconnected. The output from decoder 70 is passed to decision unit 80, and from there is output via lines 82 or 84. At substantially the same time, a new packet of data is input to buffer 62 or 64 in which the now-decoded packet was originally stored, and the decoding process is continued. Preferably, new packets are sequentially loaded into each of buffers 62 and 64 and then processed by decoder 68 independently of one another. Alternatively, buffers 62 and 64 are filled with new packets one after the other in immediate succession, so that two new packets enter the decoding process in immediately successive cycles.

Figure 2:
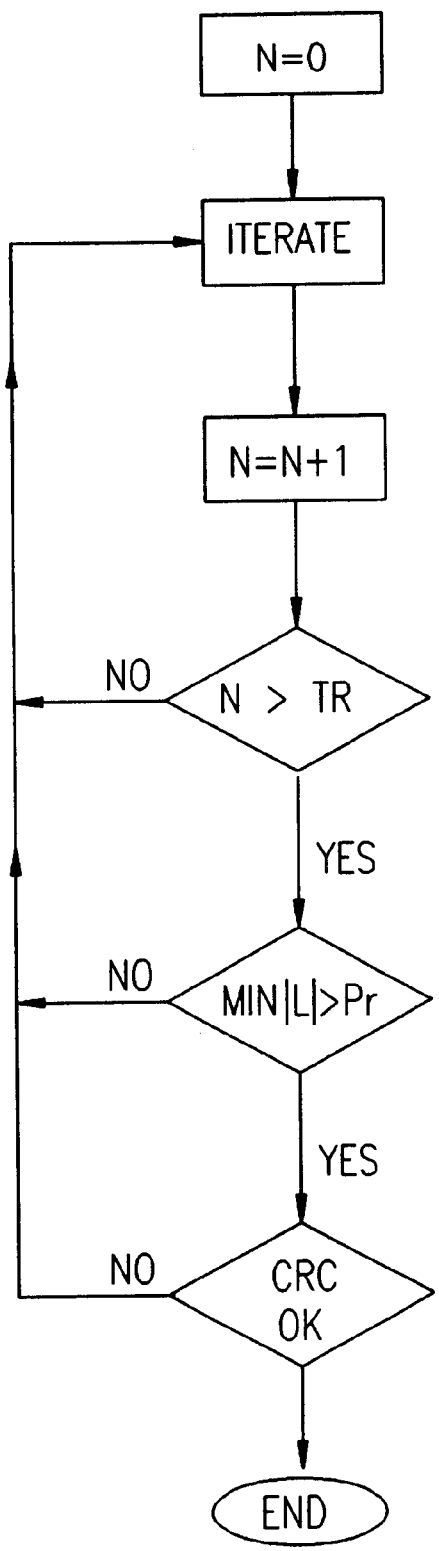
FIG. 2 is a flow chart of actions performed by a decoder to determine whether to stop decoding a packet, in accordance with a preferred embodiment of the present invention.

FIG. 2 is a flow chart illustrating an iterative decoding method performed by decoder 70 under supervision of control unit 88, in accordance with a preferred embodiment of the present invention. Preferably, for each new packet entering processor 50, a counter of the number of decoding iterations performed is set to zero. For each outer decoding iteration of the packet, the counter is incremented. Until the counter reaches a predetermined minimum number of iterations (TR), the packet is automatically passed back from decoder 70 to decoder 68 for another decoding iteration. Preferably, the predetermined number (TR) is set to the minimal number of iterations which may achieve a sufficient decoding quality suitable for output. Further preferably, the predetermined number (TR) is between four and eight.

After the predetermined number of initial iterations have been performed, decoder 70 and/or control unit 88 determine the minimal absolute value of the LLR probability values L of the bits in the packet, $min(|L|)$ i.e., the LLR probability value among all of the bits in the packet that is closest to zero. (As noted hereinabove, the bit probabilities are measured in the log domain on a scale of −32 to 31, with the extrema of the scale corresponding to high probabilities of a one or a zero, respectively.) The minimal LLR probability represents a level of confidence that the LLR probability represents the correct hard bit value. Therefore, if the minimal LLR probability value is not above a predetermined absolute probability threshold, the decoding process continues. However, if the minimal LLR probability value is above the predetermined threshold, the CRC of the packet is preferably verified, and the decoding of the packet is terminated if the CRC is correct.

Preferably, the minimal absolute value is calculated from the decoded data LLR probabilities on output line 90. Alternatively or additionally, the minimal absolute value is calculated from the coded data LLR a priori probabilities which correspond to the extrinsic information on line 92, as described hereinabove and as is known in the art.

Alternatively, decoder 70 checks either the minimum probability value or the CRC code, but not both. Further alternatively, any other measure of the progress of convergence of the probability values to the extrema is used instead of the minimum value. For example, the average or the median of the probability values of the bits may be compared to a different respective threshold. It is noted, however, that using the minimum is simple and generally requires less time to compute. In a preferred embodiment of the present invention, instead of first calculating the minimum and only then comparing to the threshold, the probabilities are compared in sequence to the minimum threshold. If a bit with a probability lower than the threshold is found, the checking is terminated and another iteration is performed.

Further alternatively or additionally, the minimum probability is adjusted to ignore outliers. Preferably, a predetermined number of probability values beneath the minimum value are ignored.

Further alternatively or additionally, the minimum or average probability is calculated on a subset of the bits in the packet, preferably on a random subset.

It is noted that the method described hereinabove of determining when to terminate the iterative decoding, is not limited to use only with decoding processor 50. The above method may be used in any iterative decoder, including Turbo code decoders and Turbo-style decoders.

It is further noted that although the above description refers to decoding methods using LLR probabilities in the log domain, the methods of the present invention may be used with other probability representations. Particularly, the methods of the present invention may be used with decoders, such as, DSP floating-point-arithmetic decoders, which represent probabilities in the normal range, i.e., between 0 and 1. In such decoders, the method of choosing the minimum probability is adjusted so that the minimum is chosen relative to a hard data decision ('0' or '1') represented by the probabilities.

It will be appreciated that the preferred embodiments described above are cited by way of example, and the full scope of the invention is limited only by the claims.

We claim:

1. Apparatus for iterative decoding of a sequence of signal packets coded in accordance with a multi-component coding scheme, comprising:
   a plurality of decoders, each of which performs a respective different decoding method on one of the signal packets, such that the plurality of decoders operate substantially concurrently; and
   a coupling means for coupling an output of one of the plurality of decoders to an input of one of the plurality of decoders.

2. Apparatus according to claim 1, wherein the plurality of decoders operate concurrently on different, respective packets.

3. Apparatus according to claim 1, wherein each of the plurality of decoders receives as its input a packet processed by another one of the plurality of decoders in most of the iterations.

4. Apparatus according to claim 1, wherein the plurality of decoders comprises two decoders.

5. Apparatus according to claim 1, and comprising a plurality of memory units to which the decoders output the packets after decoding.

6. Apparatus according to claim 1, wherein the packets are interleaved or de-interleaved after decoding.

7. Apparatus according to claim 1, wherein each of the plurality of decoders requires a generally equal decoding time to that of the other decoders.

8. Apparatus according to claim 1, wherein the multi-component coding scheme comprises a parallel coding scheme.

9. Apparatus according to claim 1, wherein the multi-component coding scheme comprises a serial coding scheme.

10. Apparatus according to claim 1, wherein the plurality of decoders comprise APP decoders.

11. Apparatus according to claim 1, wherein the plurality of decoders operate concurrently during at least 50% of the operation time during which the apparatus decodes the sequence.

12. Apparatus according to claim 11, wherein the plurality of decoders operate concurrently during substantially the entire operation time of the apparatus.

13. A method of decoding a sequence of packets of data, coded in accordance with a multi-component coding scheme including inner and outer codes, comprising:
   decoding a first packet in a first decoder, which decodes the inner code to generate a first decoded output packet; and
   decoding the first decoded output packet in a second decoder, which decodes the outer code, while substantially concurrently decoding a second packet in the first decoder.

14. A method according to claim 13, and comprising de-interleaving the first output packet before decoding it in the second decoder.

15. A method according to claim 13, wherein the multi-component coding scheme comprises a serial coding scheme.

16. A method of decoding a sequence of packets of data, coded in accordance with a multi-component coding scheme including inner and outer codes, comprising:
   decoding a first packet in a first decoder, which decodes the inner code to generate a first decoded output packet; and
   decoding the first decoded output packet in a second decoder, which decodes the outer code, while substantially concurrently decoding a second packet in the first decoder; and
wherein the second decoder decodes the first decoded output packet to generate a second decoded output packet, the method further comprising:
   providing the second decoded output packet from the second decoder to the first decoder, so as to repeat decoding the inner code.

17. A method according to claim 16, and comprising repeatedly decoding the inner and outer codes in the first and second decoders in alternation.

18. In a system for iterative decoding of a packet of soft data in which each bit is represented by a probability value, a method for determining after which of a plurality of iterations to terminate the decoding, comprising:
   determining a probability value of the bits in the packet; and
   deciding to terminate the decoding only if the probability value is above a predetermined value.

19. A method according to claim 18, wherein determining the probability value is performed only after a predetermined number of decoding iterations performed on the packet.

20. A method according to claim 18, wherein determining the probability value comprises determining the probability value on a decoded copy of the bits in the packet.

21. A method according to claim 18, wherein determining the probability value comprises determining the probability value on a coded copy of the bits in the packet.

22. A method according to claim 18, wherein determining the probability value comprises determining a minimal probability of the hard data values of the bits in the packet.

23. A method according to claim 22, wherein determining the minimal probability value comprises determining a minimal absolute log probability value.

24. A method according to claim 22, and comprising verifying that an error detection field in the packet is correct, and wherein deciding to terminate comprises deciding to terminate only if the error detection field is correct.

25. A method according to claim 24, wherein verifying that the error detection field is correct is performed when the probability value is above the predetermined value.

26. Apparatus for iterative decoding of coded packets including for each bit a probability value, comprising:
- a decoder which performs iterations of decoding the packet, the decoder comprising a first portion and a second portion, wherein the first and second portions operate concurrently; and
- a control unit which determines whether an additional iteration is to be performed by the decoder responsive to the probability values of the bits in the packet.

27. Apparatus according to claim 26, wherein the control unit causes the decoder to perform a predetermined number of iterations without checking the packet.

28. Apparatus according to claim 26, wherein the decoder comprises an APP decoder.

29. Apparatus according to claim 26, wherein the control unit determines whether an additional iteration is to be performed by the decoder responsive to an error detection field in the packet if the probability values fulfill a predetermined condition.

30. Apparatus according to claim 29, wherein the control unit does not initiate an additional iteration by the decoder if the error detection field is correct.

31. Apparatus according to claim 26, wherein the control unit calculates a minimal probability of the hard data values of the bits in the packet and determines whether an additional iteration is to be performed responsive to the minimal probability.

32. Apparatus according to claim 31, wherein the control unit calculates a minimal absolute log probability value.

33. Apparatus according to claim 31, wherein the control unit calculates the minimal probability based on a probability value of a decoded copy of the packet.

34. Apparatus according to claim 31, wherein the control unit calculates the minimal probability based on a probability value of a coded copy of the packet.

* * * * *